US009559219B1

(12) United States Patent
Okandan et al.

(10) Patent No.: US 9,559,219 B1
(45) Date of Patent: Jan. 31, 2017

(54) FAST PROCESS FLOW, ON-WAFER INTERCONNECTION AND SINGULATION FOR MEPV

(71) Applicant: Sandia Corporation, Albuquerque, NM (US)

(72) Inventors: Murat Okandan, Edgewood, NM (US); Gregory N. Nielson, Lehi, UT (US); Jose Luis Cruz-Campa, Albuquerque, NM (US); Carlos Anthony Sanchez, Belen, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/745,251

(22) Filed: Jun. 19, 2015

Related U.S. Application Data

(60) Provisional application No. 62/015,923, filed on Jun. 23, 2014.

(51) Int. Cl.
| | |
|---|---|
| *H01L 31/02* | (2006.01) |
| *H01L 31/18* | (2006.01) |
| *H01L 21/768* | (2006.01) |
| *H01L 21/288* | (2006.01) |
| *H01L 21/311* | (2006.01) |

(Continued)

(52) U.S. Cl.
CPC ... *H01L 31/02008* (2013.01); *H01L 21/02118* (2013.01); *H01L 21/2885* (2013.01); *H01L 21/311* (2013.01); *H01L 21/76802* (2013.01); *H01L 21/76871* (2013.01); *H01L 21/76877* (2013.01); *H01L 23/5386* (2013.01); *H01L 31/18* (2013.01)

(58) Field of Classification Search
CPC .............. H01L 31/02008; H01L 31/18; H01L 21/76802; H01L 21/76877; H01L 21/5386; H01L 21/2885; H01L 21/311; H01L 21/02118; H01L 21/76871; H01L 23/5386

See application file for complete search history.

(56) References Cited

U.S. PATENT DOCUMENTS

| | | | | |
|---|---|---|---|---|
| 4,872,925 A | * | 10/1989 | McMaster ....... | H01L 31/022425 136/244 |
| 8,236,611 B1 | | 8/2012 | Anderson et al. | |

(Continued)

*Primary Examiner* — Minh-Loan Tran
*Assistant Examiner* — Farid Khan
(74) *Attorney, Agent, or Firm* — Blakely Sokoloff Taylor & Zafman LLP; Aman Talwar

(57) ABSTRACT

A method including providing a substrate comprising a device layer on which a plurality of device cells are defined; depositing a first dielectric layer on the device layer and metal interconnect such that the deposited interconnect is electrically connected to at least two of the device cells; depositing a second dielectric layer over the interconnect; and exposing at least one contact point on the interconnect through the second dielectric layer. An apparatus including a substrate having defined thereon a device layer including a plurality of device cells; a first dielectric layer disposed directly on the device layer; a plurality of metal interconnects, each of which is electrically connected to at least two of the device cells; and a second dielectric layer disposed over the first dielectric layer and over the interconnects, wherein the second dielectric layer is patterned in a positive or negative planar spring pattern.

20 Claims, 7 Drawing Sheets

(51) Int. Cl.
*H01L 21/02* (2006.01)
*H01L 23/538* (2006.01)

(56) References Cited

U.S. PATENT DOCUMENTS

| | | |
|---|---|---|
| 8,329,503 B1 * | 12/2012 | Nielson ............... H01L 31/0543 257/E27.125 |
| 8,728,857 B1 | 5/2014 | Nielson et al. |
| 8,729,673 B1 | 5/2014 | Okandan et al. |
| 8,895,364 B1 | 11/2014 | Okandan et al. |
| 8,906,803 B2 | 12/2014 | Okandan et al. |
| 9,130,092 B1 * | 9/2015 | Nielson ............ H01L 31/022441 |
| 2008/0299297 A1 * | 12/2008 | Cousins ............. H01L 21/76802 427/74 |
| 2015/0207023 A1 * | 7/2015 | Nielson ............... H01L 31/1876 438/68 |

* cited by examiner

FAST PROCESS FLOW, ON-WAFER INTERCONNECTION AND SINGULATION FOR MEPV

CROSS-REFERENCE TO RELATED APPLICATION

This application claims the benefit of the earlier filing date of U.S. Provisional Patent Application No. 62/015,923, filed Jun. 23, 2014 entitled "FAST PROCESS FLOW AND ON-WAFER INTERCONNECTION AND SINGULATION FOR MICROSYSTEMS-ENABLED PHOTOVOLTAICS." The aforementioned application is hereby incorporated by reference, in its entirety, for all purposes.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

Integrated circuit assemblies and processing.

BACKGROUND

The fabrication of microsystem enabled photovoltaic (MEPV) cells of individual devices and other integrated sensors and power assemblies often requires connections to be formed between devices of different cells and between devices of a cell and other elements. Currently, such fabrication includes a number of processing steps that generally follow the creation of the circuit cells on a wafer. Representative of such processing steps are the separation of individual cells from a wafer of cells, the alignment of separated cells, and the fabrication and connection of conductors between the cells.

SUMMARY

In one embodiment, a method of forming an assembly or apparatus of interconnected device cells is described. In one embodiment, the method includes providing a substrate such as a wafer comprising a device layer on which a plurality of device cells are defined; depositing a first dielectric layer on the device layer; and depositing a metal interconnect on the first dielectric layer such that the deposited interconnect is electrically connected to at least two of the device cells and lies across a boundary between at least two of the electrically connected device cells. The method also includes depositing a second dielectric layer over the first dielectric layer and over the interconnect and exposing at least one contact point on the interconnect through the second dielectric layer. Where a degree of mechanical flexibility in the assembly or apparatus is desired, the method also includes forming one or more openings in the second dielectric layer between the circuit cells or tethering the interconnect material around the interconnect.

Also disclosed is an apparatus or assembly including a plurality of device cells. In one embodiment, an apparatus includes a substrate having defined thereon a device layer on which a plurality of device cells are formed; a first dielectric layer disposed directly on the device layer so as to overlie and encase the device cells; a plurality of metal interconnects, each of which is electrically connected to at least two of the device cells and lies across a boundary between at least two of the electrically connected device cells; and a second dielectric layer disposed over the first dielectric layer and over the interconnects. At least the second dielectric layer of the apparatus is patterned in a positive or negative planar spring pattern.

BRIEF DESCRIPTION OF THE DRAWINGS

The invention may best be understood by referring to the following description and accompanying drawings that are used to illustrate embodiments of the invention. In the drawings.

DETAILED DESCRIPTION

A method of forming an assembly or apparatus of interconnected device cells is described. In the following description, reference is made to an apparatus or assembly of solar circuit cells (e.g., MEPV circuit cells). It is appreciated that the discussion herein is not limited to assembly of MEPV circuit cells but may be applied to assemblies of other circuit cells or the connection of a circuit cell to other components beyond the circuit cell.

Figure 1:
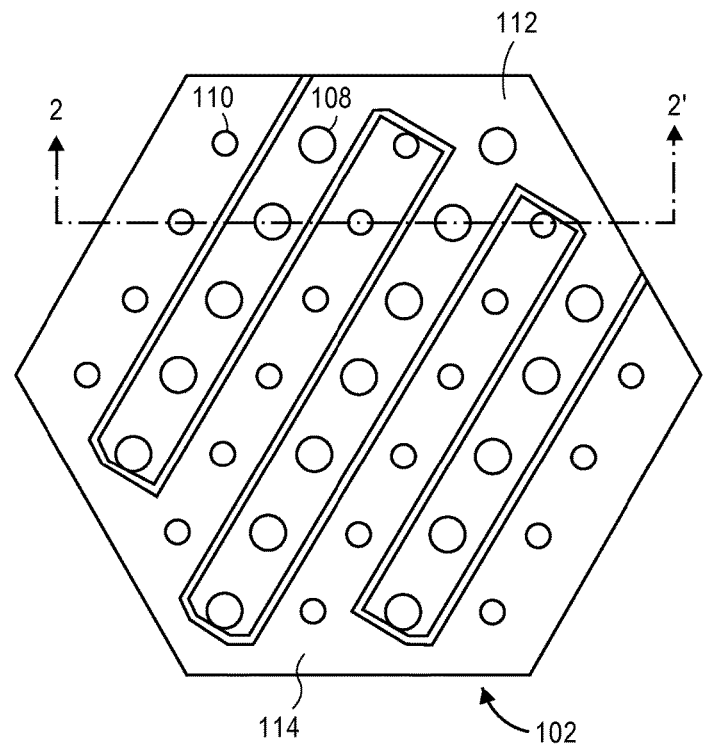
FIG. 1 schematically illustrates an example of a photovoltaic solar cell.
Figure 2:
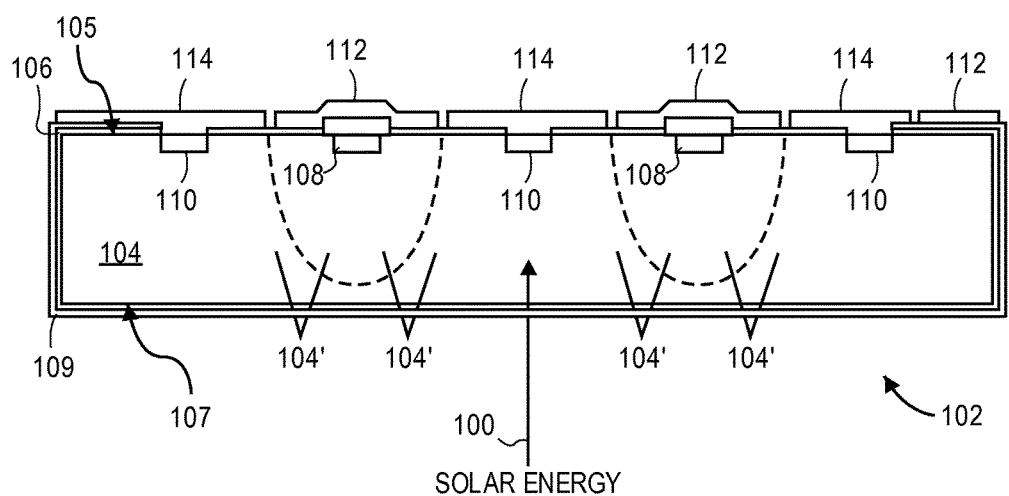
FIG. 2 shows the photovoltaic solar cell of FIG. 1 through line 2-2'.

FIG. 1 and FIG. 2 schematically illustrate an example of a photovoltaic solar cell. In FIG. 1, a device side surface of solar cell 102 is shown, the device side including contacts and traces thereon. In general, a side of solar cell 102 opposite the device side will serve as the primary side for incident photon absorption. FIG. 2 shows a schematic cross-section along the section line 2-2' in FIG. 1. The terms "photovoltaic solar cell", "solar cell" and "cell" may be used interchangeably in the description to refer to photovoltaic solar cell 102.

Solar cell 102 may be a transverse-junction solar cell (also referred to as a point contact solar cell). In this aspect, solar cell 102 includes a plurality of spaced apart transverse semiconductor junctions that generate electron-hole pairs.

The spaced apart transverse junctions include n-type-doped and p-type doped regions formed in a semiconductor substrate 104 which can be lightly doped (e.g., to $10^{17}$ cm$^{-3}$ or less) with a p-type or an n-type impurity dopant. Alternately, semiconductor substrate 104 can be intrinsic (i.e., not intentionally doped). Representatively, tens to hundreds of transverse semiconductor junctions can be located in solar cell 102 that can have lateral dimensions of generally from about 0.1 mm to about 1 millimeter (mm), with adjacent transverse semiconductor junctions being representatively separated by about 20 micrometers (μm) to about 50 μm.

A description of solar cell 102 and its fabrication will be presented hereinafter in the non-limiting example of silicon-based technology. Fabrication of solar cell 102 in other semiconductor materials such as germanium, group II-VI compound semiconductors, or group III-V compound semiconductors such as GaAs, InGaP, InGaAs, or InGaN is also contemplated and should be understood as falling within scope of the invention.

Substrate 104 is a silicon substrate that is, for example, a portion of a silicon wafer that may or may not be thinned (e.g., thinned to a thickness on the order of 5-100 μm by, for example, mechanical grinding). Substrate 104 includes device side 105 into which p-n junctions, contacts and traces are formed and an opposite backside 107. Disposed or formed on device side 105 and backside 107 of substrate 104 is passivation layer 106 of, for example, silicon dioxide representatively formed by a thermal oxidation process. One purpose of a passivation layer is to reduce a number of dangling silicon bonds on a surface of substrate 104 to reduce a top surface recombination rate. In one embodiment, disposed or formed on passivation layer on device side 105 and backside 107 is diffusion barrier layer 109, of, for example, silicon nitride. Silicon nitride can also act as an anti-reflective coating. One way to form diffusion barrier layer 109 of silicon nitride is by chemical vapor deposition (CVD). Collectively, passivation layer 106 and diffusion barrier layer 109 can be, for example, from about 25 to about 200 nanometers (nm) thick.

A plurality of generally circular openings having a representative width of up to a few microns (μm) are formed through passivation layer 106 and diffusion barrier layer 109 and optionally partway through substrate 104 on device side 105 to a depth of a few microns. Such openings can be formed by an anisotropic etch process using a reactive ion etching process with a photolithographically defined etch mask (not shown). These openings can be used to define doped regions to create p-n junction (diode) devices for the solar cell.

To create the doped regions, the openings are filled with a semiconductor material such as, for example, crystalline silicon or polycrystalline silicon (also referred to as "polysilicon" or "poly") or other semiconductor material. FIG. 2 shows doped silicon region 108 having a doping type which is opposite to the doping type of substrate 104 (e.g., n-type doped when substrate 104 is p-type doped). The opposing regions of different dopant type (e.g., n$^+$/p$^+$) create a junction and define a diode. The semiconductor material can be deposited by CVD, performed so as to fill in the openings and to extend over the top of substrate 104 (top surface as viewed in FIG. 2). A reactive ion etching (RIE) process using another photolithographically defined etch mask can then be used to remove any excess semiconductor material to provide an exposed circular or polygonal top surface for doped region 108 as shown FIG. 2. Alternatively, ion implantation or solid source diffusion of dopants can be used to create the doped region 108 without requiring a silicon deposition.

Region 110 with a doping type the same as substrate 104 can be formed adjacent to each doped region 108 through the use of ion implantation or solid source diffusion (which would require opening a window in the passivation layer). The dopant concentration in doped region 110 is higher than that of substrate 104 (e.g., p+ doped when substrate 104 is p− doped). Ions, exemplarily of boron or phosphorus, are implanted into substrate 104 to form an ion-implanted region 110 doped respectively p-type or n-type, as desired. Doped region 110 can extend down into substrate 104 for a representative distance of up to about 1 μm.

Electrical contact or trace 112 can be deposited on substrate 104 to contact some or all of doped region 108 in a parallel, series, or parallel-series arrangement. Electrical contact 112 is exemplarily an aluminum electrode. It is shaped exemplarily as shown in FIGS. 1-2. Another electrical contact or trace 114 can similarly contact some or all of doped region 110 in a parallel, series or parallel-series arrangement. Electrical contact 114 is exemplarily an aluminum electrode similar to electrical contact 112. Electrical traces 112 and 114 are electrically isolated from substrate 104 by intervening passivation layer 106.

Placement of both electrical contacts 112 and 114 on the device side of solar cell 102 simplifies the electrical connections to solar cell 102. Also, under solar or other illumination, incident photons 100 that enter solar cell 102 via backside 107 of substrate 104 are not shaded by electrical contacts 112 and 114 since the photons enter solar cell 102 on a side opposite contacts 112 and 114. Furthermore, electrical contacts 112 and 114 act as mirrors to reflect any of the photons that are not absorbed in light-absorbing regions 104' (i.e., portions 104' of semiconductor substrate 104 between each adjacent pair of the electrical contacts 112 and 114). That is, the electrical contacts reflect the photons back for a second passage through the light-absorbing region 104'. This increases the efficiency of solar cell 102 for generating electricity by increasing the amount of photons absorbed in solar cell 102 to produce electrical charge carriers (i.e. electrons and holes) therein.

Generally, a large number of solar cells 102 will be fabricated on a 100 mm to 300 mm wafer and then separated. Each solar cell 102 may have a polygonal shape with lateral dimensions of, for example, up to about 1 millimeter (mm), for example, from about 0.25 mm to about 0.75 mm, or from 0.4 to 0.6 mm. In some embodiments, the lateral dimensions may be a length and a width dimension that are substantially equal such that solar cell is symmetrical about at least two perpendicular axes 116, 118. Representative polygonal shapes may include, but are not limited to, a hexagon, a square, a rectangle or a triangle. Although polygonal shapes are disclosed, it is contemplated that solar cell 102 may have any other shape deemed desirable, for example, a circular shape. Each photovoltaic solar cell 102 can be made thin (e.g., <50 μm and preferably <20 μm, such as from 5-10 μm) to mitigate against bulk Auger recombination which can occur when a density of photogenerated carriers is non-uniform over the thickness of solar cell 102.

FIGS. 3-7 show a method of forming a conductive path or interconnect between different semiconductor circuit cells (e.g., different solar cells) along which an electrical current can be carried. Such interconnect may be used to connect a device of one cell to a device of another cell. A device, as used herein, includes an individual device such as a conductor, a discrete device that performs a particular function (e.g., a diode), or a group of discrete devices connected, for example, in a sub-circuit. An interconnect might or might not connect similar devices on different cells. Representatively, an interconnect may be connected to a conductor of one cell and to a discrete device of another cell; to a discrete device of one cell and to a discrete device of another cell; to a discrete device of one cell and to a subcircuit of another cell; or to a conductor of one cell and to a conductor of another cell.

Figure 3:
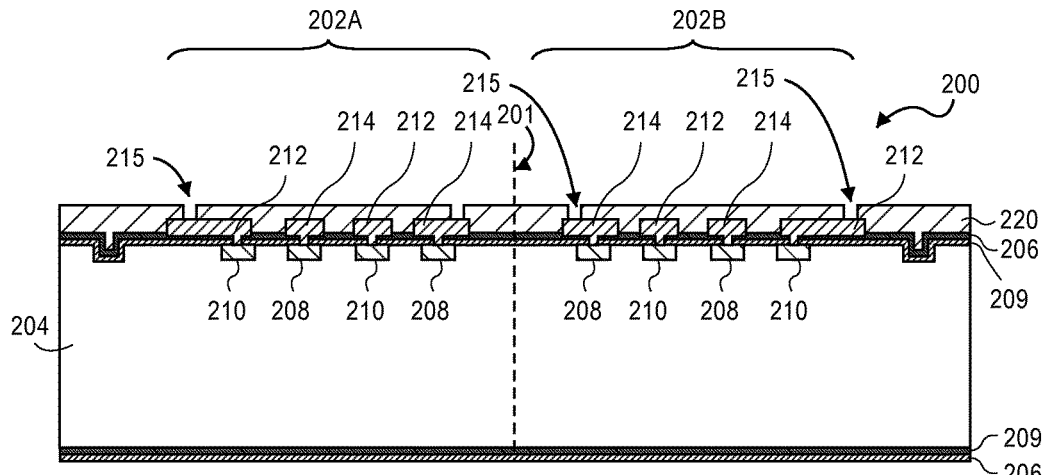
FIG. 3 shows a cross-sectional side view of a portion of a semiconductor wafer illustrating two adjacent cells each having a number of devices formed therein and thereon (e.g., p-n junction devices).

FIG. 3 shows exemplary structure 200 of a silicon or other semiconductor wafer illustrating two adjacent circuit cells each having a number of devices formed therein and thereon (e.g., p-n junction devices). Dashed line 201 is included to show a boundary between circuit cell 202A and circuit cell 202B. As will be seen below, the method illustrated by FIG. 3 and following figures involves an interconnection between devices of the adjacent cells prior to a separation of the cells from one another as part of a common wafer by way of a singulation process.

Substrate 204 includes circuit cell 202A (one solar cell) and circuit cell 202B (one solar cell). Disposed in each solar cell region are oppositely doped regions 210 and 208 (doped p-type and n-type). Disposed on a device surface of substrate 204 (a top surface as viewed) is passivation layer 206 of, for example, silicon dioxide (e.g., a thermally grown oxide on the order of 100 Å thickness) and diffusion barrier layer 209 such as a silicon nitride deposited by CVD to a thickness on the order of 600 Å.

FIG. 3 also shows electrical contacts or traces 212 and 214 of, for example, an aluminum material defining a first metal layer on passivation layer 206 and connected to doped regions, 210 and 208, respectively. Overlying or on the electric contacts on a device layer of substrate 204 is first dielectric layer 220 of, for example, a polyimide material or other flexible dielectric material such as a dry film photoresist (DFR). In one embodiment, first dielectric layer 220 of a photo-definable polyimide is deposited by a spin-on technique to a thickness on the order of 2-3 μm and solidified through a photo-polymerization process.

Following the introduction (e.g., deposition) of dielectric layer 220, openings are formed to contacts 212 and 214. Such openings may be formed through a mask and etch process or a laser drilling process. FIG. 3 shows openings 215 formed through dielectric layer 220 to respective ones of contacts 212 and 214.

Figure 4A:
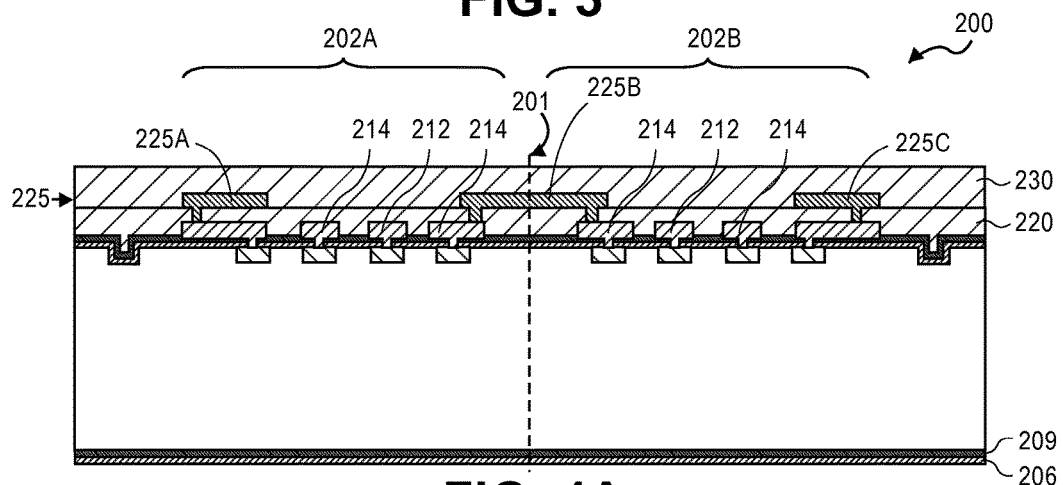
FIG. 4A shows the device structure of FIG. 3 following the introduction of a second metal layer on the structure and a second dielectric material formed on the second metal layer.

FIG. 4A shows the device structure of FIG. 3 following the introduction of second metal layer 225 of the structure and second dielectric layer 230 formed on second metal layer 225. With further reference to FIG. 4A, there is shown a second metal layer 225 patterned into traces 225A, 225B and 225C. One way to form second metal layer 225 into traces is to deposit a solderable metal stack in the openings and define traces of gold with the solder of, for example, 2 μm to 3 μm thick material on first dielectric layer 220.

Another process to form a patterned second metal layer 225 involves a two-phase process, i.e. an electroless process followed by an electrolytic process. Representatively, a seed material such as a gold material is deposited in the vias and on a surface of first dielectric layer 220. A patterned mask is then introduced on the surface of dielectric layer 220 including the seed material. The patterning defines a trace routing for traces 225A, 225B and 225C (which are all part of second metal layer 225) through, for example, openings in the mask. Metal (e.g., gold) is then plated by an electrolytic process on the exposed seed material on dielectric layer 220 and in the vias. In one embodiment, the electrolytically-plated material has a thickness on the order of 10-20 μm.

Following the electrolytic deposition of the trace material, the mask used to define the pattern (e.g., a dry film resist mask) is removed by, for example, stripping to leave traces 225A-225C. A flash etch may be carried out to remove the exposed seed material between the formed traces.

In the embodiment illustrated in FIG. 4A, trace 225B extends between two circuit cells, notably across dashed vertical line 201 through which cell 202A and cell 202B will be divided or singulated. In other words, trace 225B is an electrically conductive interconnect that lies across boundary 201 between cell 202A and cell 202B and is electrically connected (e.g., trace 225B provides a direct current path) to a device on cell 202A and a device of cell 202B. Trace 225A and trace 225B may be patterned as contact pads.

Following the formation of traces 225A-225C, second dielectric layer 230 is introduced (e.g., deposited) on the structure. FIG. 4A shows second dielectric layer 230 of, for example, a spin-on photo-definable polyimide or a dry film resist on structure 200 on or over (as viewed) second metal layer 225. Second dielectric layer 230 is deposited as a blanket layer over second metal layer 225 and over cell 202A and cell 202B and areas between such cells and other cells of structure 200. A representative thickness of dielectric layer 230 is 2-3 μm.

Figure 4B:
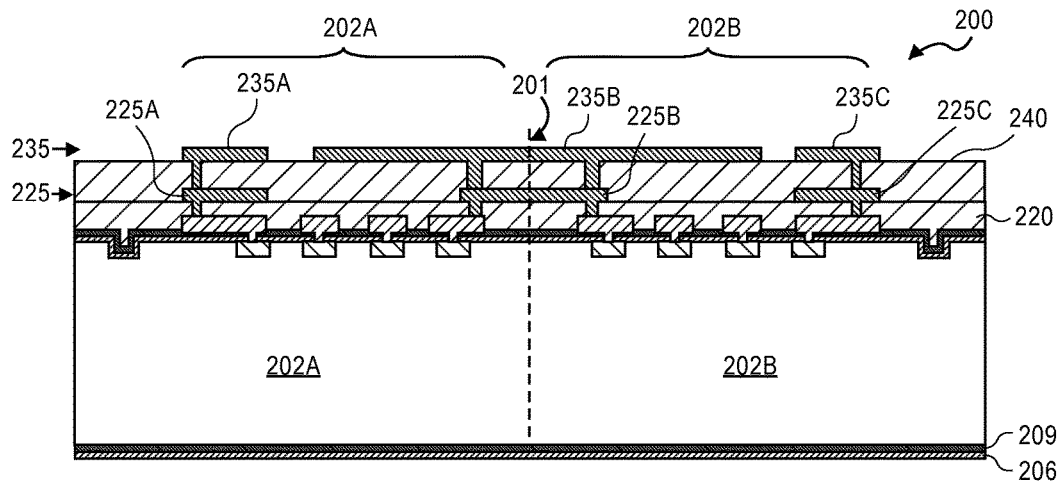
FIG. 4B shows an optional process of adding a third metal layer to the device structure.

FIG. 4B shows an optional process of adding a third metal layer to the device structure. The process of adding a third metal layer may be similar to the process of adding the second metal layer that resulted in the formation of traces 225A-225C described with reference to FIG. 4A. FIG. 4B shows dielectric layer 230 on traces 225A-225C and openings (e.g., vias) formed in the dielectric layer to the traces. FIG. 4B also shows third metal layer 235 including electrically conductive traces 235A, 235B and 235C introduced and patterned as a third metal layer on the structure. Trace 235A is connected through a conductive via to trace 225A; trace 235B is connected through conductive vias to trace 225B; and trace 235C is connected through conductive vias to trace 225C.

Figure 5:
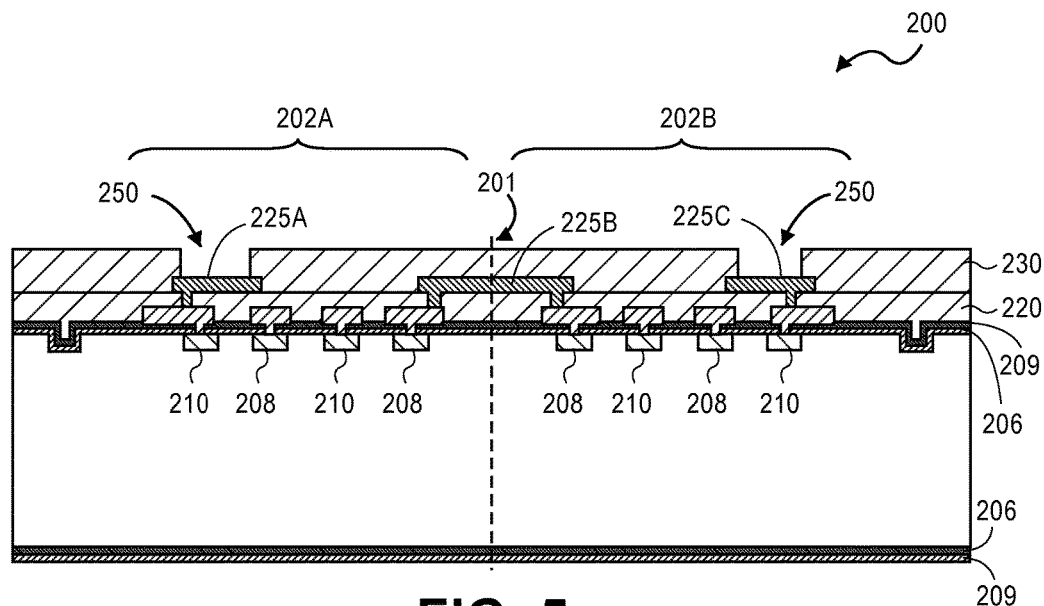
FIG. 5 shows the device structure of FIG. 4A following the formation of openings to certain ones of the traces of the second metal layer.

FIG. 5 shows the device structure of FIG. 4A having a single layer of conductive traces (in second metal layer 225) disposed on a device layer of the substrate. In this example, following the formation of traces 225A-225C and passivation with dielectric layer 230, openings 250 are made to certain ones of the traces that are defined, representatively, as contact points or pads. In the embodiment shown in FIG. 5, circuit cell 220 of substrate 204 includes a contact pad at trace 225A and circuit cell 202B includes a contact pad at trace 225C. Openings to the contact pads may be made by a mask and etch process or a laser drilling process.

In one example of further processing, the structure shown in FIG. 5 is bonded to a carrier 260. In one embodiment, carrier 260 is a sacrificial structure utilized to support structure 200 during further processing, including, but not limited to singulation of individual cells or groups of cells of structure 200. After such further processing, individual cells or groups of cells of structure 200 or all of structure 200 will be separated from carrier 260.

Figure 6:
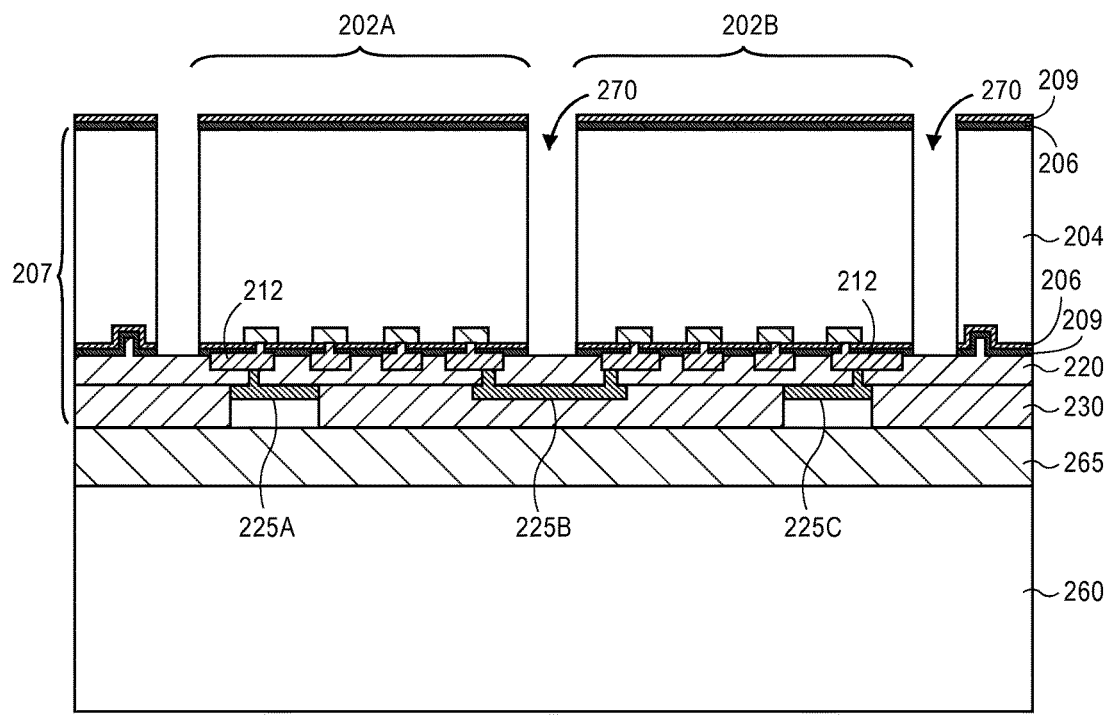
FIG. 6 shows the structure of FIG. 5 following an attachment of the device structure of FIG. 4A to a carrier substrate or wafer.

FIG. 6 shows the device structure of FIG. 5 following an attachment of the structure to a carrier substrate or wafer and the scribing of the device structure. Typically, the structure is inverted and bonded to the carrier device-side down, i.e. with the device layer proximal the carrier wafer. Substrate 200 is then singulated to separate the individual device cells from each other. Because the cells are mechanically stabilized by bonding to the carrier wafer, it is possible to perform the singulation without damaging the cell-to-cell interconnects. Further details of such a process are provided in the following paragraphs.

FIG. 6 shows carrier 260 of, for example, a semiconductor, glass, quartz, or metal structure having dimensions (e.g., cross-sectional area) to support substrate 200 including adhesive layer 265 on a surface thereof. Adhesive layer 265 is, for example, a thermal release tape or a soluable glue material. Following the bonding, substrate 204 may optionally be thinned by a mechanical grinding process. Following any optional thinning of substrate 204, the substrate is patterned from a backside to define individual circuit cells of substrate 204 as part of a singulation on dicing process. A representative process includes an etch process, such as a deep reactive-ion etching process using anisotropic etchant such as sulfur hexafluoride ($SF_6$) for a silicon material.

A backside of substrate 204 is representatively initially protected by a dielectric material (e.g., an oxide) prior to the etch process and a mask is patterned to define areas for etching. FIG. 6 shows openings 270 formed by the etch through substrate 204 and through passivation layer 206 and diffusion barrier layer 209. In one embodiment, the etch does not go through first dielectric layer 220 or dielectric layer 240. In this instance, the etch may be described as selective for a material of substrate 204 (e.g., silicon) relative to a material of first dielectric layer 220 (e.g., polyimide). It will be appreciated that some of first dielectric layer 220 may be removed before the etch is stopped.

Openings 270 separate the substrates of the respective cells (e.g., separate a portion of substrate 204 of circuit cell 202A from a portion of substrate 204 of circuit cell 202B). The cells are still connected to one another through dielectric layer 220 and dielectric layer 230 as well as any interconnects extending between cells. The etch of substrate 204 may be described as a partial singulation of each of the individual cells of the structure 200. Complete singulation of individual cells from one another or groups of cells from other individual cells or groups of cells is described below. Following the separation of substrates of respective cells, the sidewalls of the individual substrates may be cleaned with, for example, a hydrofluoric acid (HF) vapor.

Figure 7:
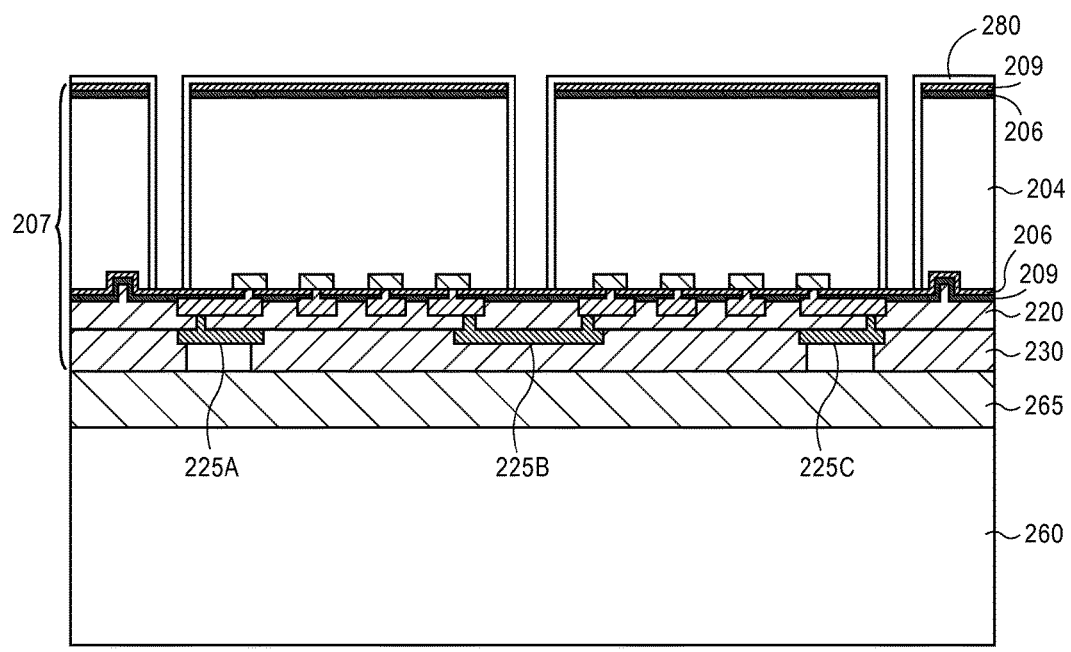
FIG. 7 shows the structure of FIG. 6 following the deposition of a passivation material on the backside of the device structure.

FIG. 7 shows the structure of FIG. 6 following the deposition of a passivation material on a backside of the device structure. In one embodiment, passivation layer 280 is an alumina material deposited, for example, to a thickness on the order of 150 Å by an atomic layer deposition process. In one embodiment, the deposition of passivation layer 280 is conformally coated on both the lateral backside surface and on the vertical surfaces within the openings 270. A passivation layer of a dielectric material such as alumina electrically isolates the sidewalls and backside of the individual cells and provides an anti-reflective coating for the light input side of the cell. Following the deposition of passivation layer 280, the structure may be annealed at, for example, a passivation anneal temperature on the order of 250° C. to 300° C. Cells may then be removed from carrier substrate 260 in one piece (i.e., all the cells are separated from carrier 260 together).

Respective ones of the cells or groups of cells may then be separated from others in subsequent processing operations as described below. Alternatively, an individual cell or groups of interconnected cells may be discretely removed from carrier 260. Separation of a cell or cells, including all the cells, from carrier 260 may be done by separating the cells from adhesive layer 265 by, for example, a heat treatment in the case of a thermal release tape or by the contacting of adhesive layer 265 with a solvent in the case of a soluable adhesive.

Figure 8:
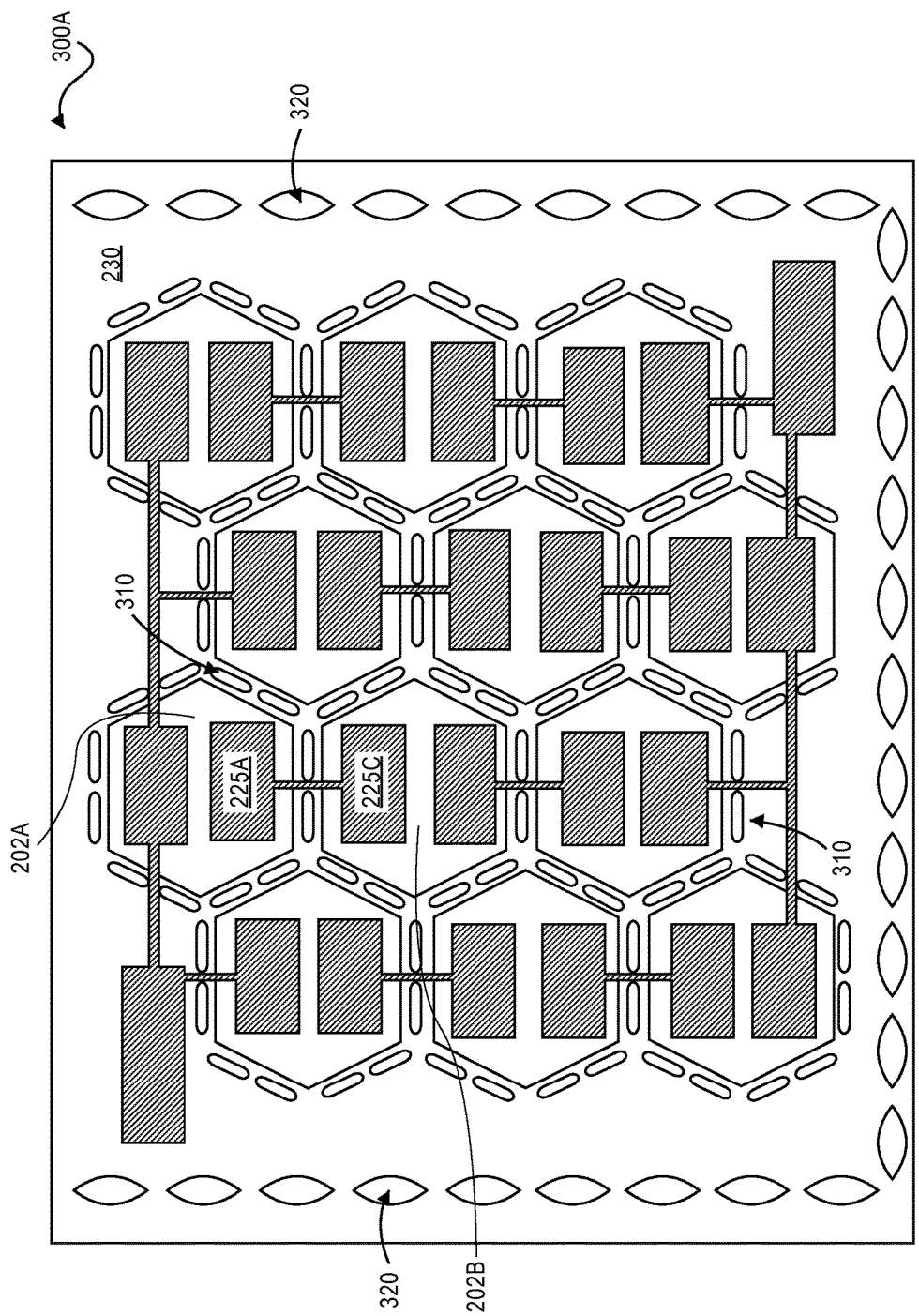
FIG. 8 shows a top view of an apparatus or assembly of a number of circuit cells.

FIG. 8 shows apparatus or assembly 300A of a number of circuit cells, notably a number of solar cells that have been removed from carrier 260. The cells may be formed as described above with reference to FIGS. 2-7. Included in assembly 300A among the individual circuit cells are cell 202A and cell 202B and second dielectric layer 230 formed around and between the circuit cells. FIG. 8 shows trace 225A illustrated as a contact pad on circuit cell 202A and trace 225C illustrated as a contact pad on circuit cell 202B. FIG. 8 shows trace 225B as an interconnect between circuit cell 202A and circuit cell 202B.

In the above description, second metal layer 225, including traces 225A, 225B and 225C, was formed on first dielectric layer 220 and second dielectric layer 230 was then formed on second metal layer 225. Each dielectric layer, in one embodiment, was selected to be of a flexible dielectric material such as a photopolymerizable polyimide or a dry film photoresist. As illustrated in FIG. 5, for example, each of first dielectric layer 220 and second dielectric layer 230 is formed, in an embodiment, as a blanket layer on a device side surface of structure 200 and to overlie each individual cell and the areas between the cells (e.g., in an area between cells 202A and cell 202B).

In an embodiment, the dielectric material between the cells (second dielectric layer 230 and optionally first dielectric layer 220) is modified to, for example, provide increased flexibility for a group of cells (two or more) that may be interconnected and intended to collectively define an assembly of cells. FIG. 8 shows perforations 310 formed through second dielectric layer 230 and optionally through first dielectric layer 220 (see FIG. 7) around the individual cells. Perforations 310 are shown as curved or having rounded edges. In one embodiment, perforations are elongated from, for example, a circular shape. Shapes for perforations 310 include, but are not limited to, circular, oval, elliptical, and stadium (i.e, resembling a rectangle with semicircles at a pair of opposite sides) shapes.

FIG. 8 shows such perforations 310 surrounding each circuit cell in the assembly. Rounded, possibly elongated, perforations do not have sharp edges. Absent sharp edges, such shapes tend to allow a flexible dielectric material like a polyimide or dry film photoresist to elongate when subject to a force or opposing forces. Hence, it can stretch when, for example, assembly 300A is bent or manipulated from a planar configuration to a nonplanar configuration such as an arched or twisted configuration.

The flexible dielectric material, in one embodiment, allows assembly 300 to return more or less to its original shape when the force or forces are removed provided the material is not plastically deformed. By virtue of the elasticity that the perforations 310 provide at least in the intracellular portions of second dielectric layer 230 (and optionally first dielectric layer 220), a negative planar spring pattern is defined in the dielectric layer or layers. (The spring pattern is "negative" in the sense that material is removed to create the elasticity-imparting perforations.) In other embodiments, a positive planar spring pattern is defined by providing tethers (as will be described below) or other elasticity-imparting features.

FIG. 8 also shows perforations 320 at a singulation area or boundary of assembly 300A of circuit cells. Perforations 320, in one embodiment, have sharper edges than perforations 310. Representative shapes include, but are not limited to, diamond, rhombus, sharp elliptical, rectangular and lens shapes. Perforations 320 are illustratively shown in the figure as having a lens shape. The sharp-edged perforations 320 are included to facilitate singulation of assembly 300 from, for example, adjacent assemblies that are formed at the same time.

In one embodiment, perforations 310 and 320 extend partly into or all the way through second dielectric layer 230 and optionally partly into or all the way through first dielectric layer 220. The perforations are defined, e.g., following the deposition and any curing of second dielectric layer 230.

Representatively, the perforations are introduced through an etching process. In the etching process, the circuit cell and areas adjacent to circuit cell are masked leaving only defined mask openings around the circuit cells. This is followed by an etch process to remove dielectric material, and then by removal of any such mask.

Perforations 320 allow a mechanical separation such as by physically pulling assembly 300A apart from a larger body of multiple assemblies. The separation can also be achieved by a die cutting a laser cutting along perforations 320. A partial singulation or dicing was described above with reference to FIG. 6 and the accompanying text.

A final singulation or dicing of individual device cells from structure 200 or groups or assemblies of device cells is accomplished, in one embodiment, by mechanical separation or by die cutting or laser cutting first dielectric layer 220 and second dielectric layer 230 at the desired boundaries of separation. Such final singulation process may be performed while the device cells are separated from carrier 260 or, in another embodiment, while the device cells are attached to carrier 260.

Figure 9:
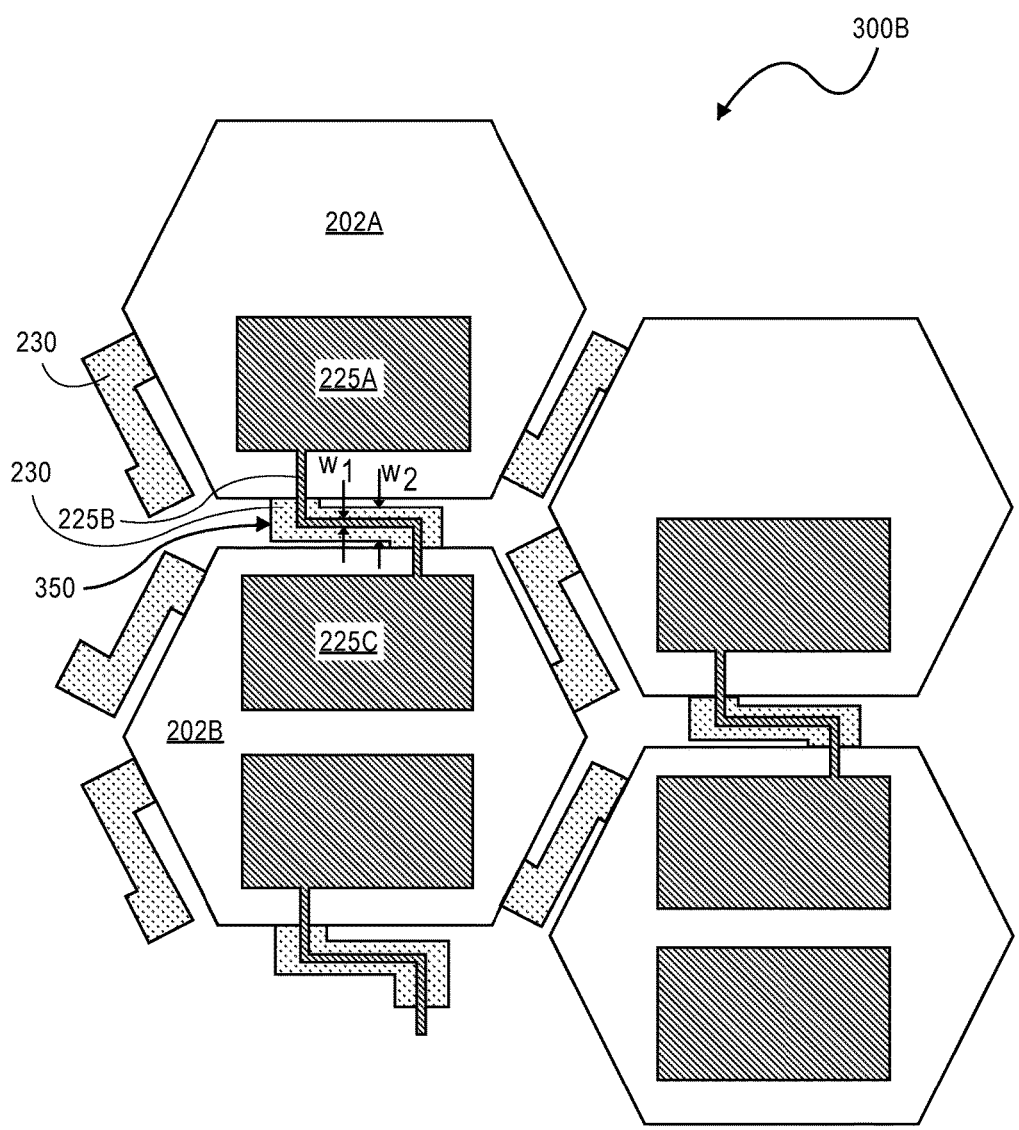
FIG. 9 shows a top view of another embodiment of an assembly of circuit cells.

FIG. 9 shows another embodiment of an assembly of circuit cells. FIG. 9 shows assembly 300B including circuit cell 202A and circuit cell 202B referenced above with regard to FIGS. 2-7. Similar to FIG. 8, trace 225A is illustrated to include a contact pad on circuit cell 202A and trace 225C is patterned to include a contact pad on circuit cell 202B. A device on circuit cell 202A is connected to a device on circuit cell 202B through interconnect 225B.

FIG. 9 shows dielectric material in an area adjacent to the individual circuit cells. The dielectric material includes first dielectric layer 220 and second dielectric layer 230. In this embodiment, the dielectric material (e.g., at least second dielectric layer 230) in areas between circuit cells is patterned into tethers that surround the interconnect (e.g., interconnect 225B shown in the figure) between cells or that are limited to areas adjacent to the interconnect between cells. In other words, except for the tethered interconnect areas, second dielectric layer 230 and optionally first dielectric layer 220 are removed from areas between the individual circuit cells. The tethering of the interconnects tends to increase flexibility and moldability of a circuit cell assembly. ("Moldability" describes the capability of assembly 300B to conform to a three-dimensional surface of arbitrary shape, limited only by a specified minimum radius of curvature at each point.)

In one embodiment, a shape of a tether of a dielectric layer mimics or is generally similar to a shape of an interconnect between two cells. Representatively, a tether has a width dimension $W_2$ that is greater than a width dimension $W_1$ of the interconnect. The interconnect is surrounded on all sides by either first dielectric layer 220 or second dielectric layer 230 to provide electrical isolation and support (e.g., a measure of substance or durability or protection to the interconnect). In one embodiment, the tethers are made with one or more right angles or a serpentine shape, or another shape that has in-plane bends that can accommodate increases and decreases in the cell-to-cell separation during flexion. Such tethers may be formed by a masking and etch process where the tether areas are defined by a mask. Areas of dielectric layer between the circuit cells where a metal interconnect is not present or that are otherwise not covered by the mask are removed by an etch process and subsequently the mask is removed. In one embodiment, the only dielectric material between device cells of an assembly such as assembly 300B is dielectric material tethering a metal interconnect.

Figure 10:
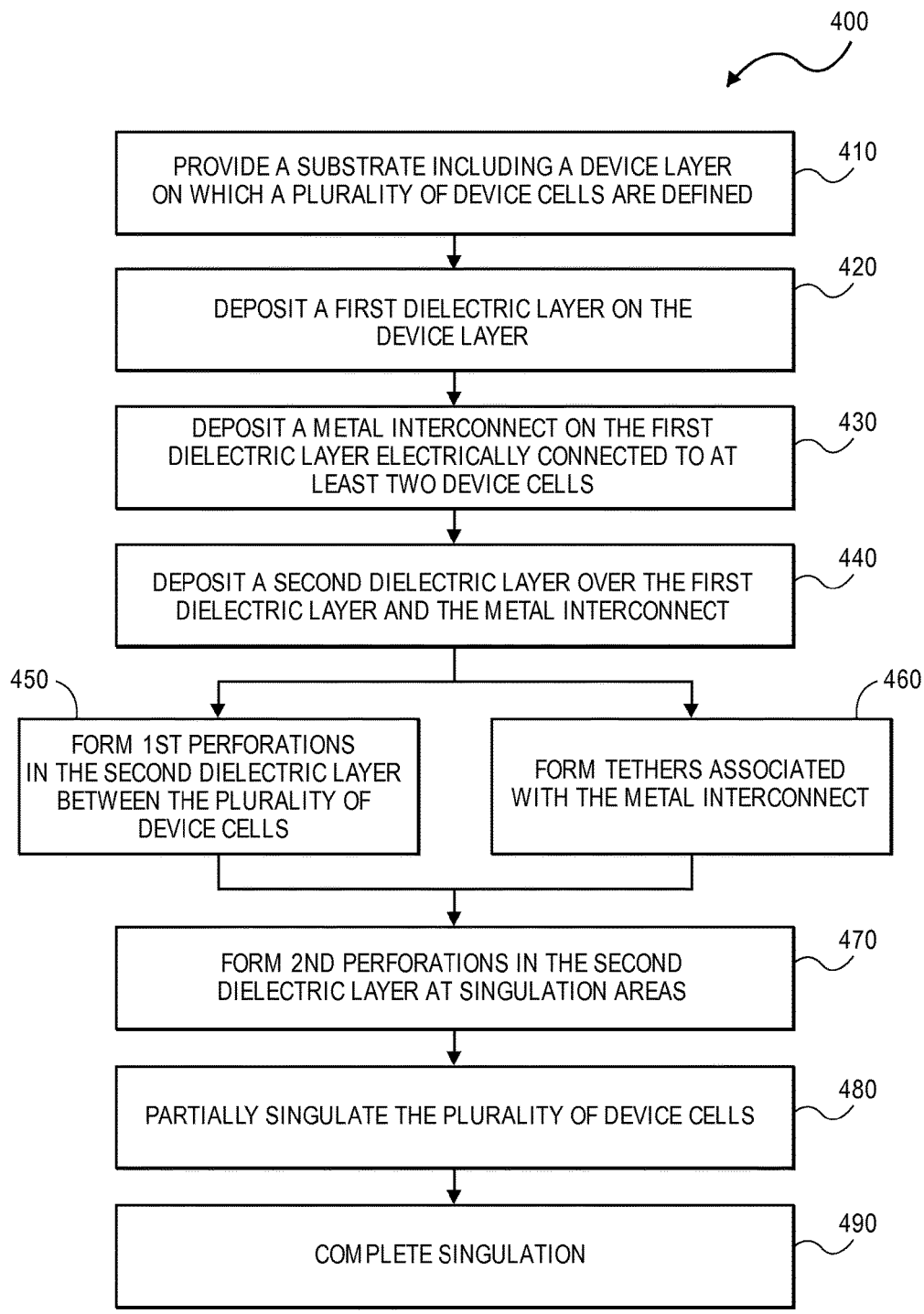
FIG. 10 is a flow chart of an embodiment of a method of forming an assembly of interconnected device cells.

FIG. 10 shows a flowchart of a process of forming an assembly or apparatus of interconnected device cells. Referring to the method 400, the method includes providing a substrate including a device layer on which a plurality of device cells are defined (block 410). Such device cells may include, but are not limited to, solar device cells (MEPV cells). Method 400 also includes depositing a first dielectric layer on the device layer (block 420). In one embodiment, a first dielectric layer is a flexible dielectric material such as a photo-definable polyimide or a dry film resist deposited to a thickness on the order of 2-3 nm.

Following the deposition of the first dielectric layer, the method includes forming openings in the first dielectric layer to contact points of the device layer (e.g., devices), followed by depositing a metal interconnect on or over the first dielectric layer. The metal interconnect, exemplarily a gold interconnect, is connected to at least two device cells (to a device in a first device cell and a device in a second device cell) (block 430). In addition to forming a metal interconnect on the first dielectric layer, metal contacts and traces may also be formed to devices of ones of the plurality of device cells on the substrate.

Following the deposition of a metal interconnect on a first dielectric layer, the method 400 includes depositing a second dielectric layer over the first dielectric layer and the metal interconnect (block 440). A suitable material for a second dielectric layer is a flexible dielectric material such as a photo-definable polyimide or a dry film photoresist deposited to a thickness on the order of 2-3 μm. An additional metal layer (e.g., contacts, traces, interconnects) may optionally be deposited on the second dielectric layer and connected to an underlying metal layer (e.g., the metal interconnect) or to devices on the substrate.

After depositing a second dielectric layer over the first dielectric layer and the metal interconnect or any additional metal layer and dielectric layer, method 400 continues with forming first perforations in the second dielectric layer and, optionally, the first dielectric layer, in areas between the plurality of device cells (block 450). Such perforations, in one embodiment, have circular, elliptical or stadium shapes with curved or rounded edges that tend to allow a flexible material like a polyimide or a dry film photoresist to elongate when subject to a force or forces (e.g., opposing forces).

In one embodiment, the first perforations may be formed by a masking and etch process. In another embodiment, rather than forming first perforations in the second dielectric layer and optionally the first dielectric layer, the method 400 includes forming the second dielectric layer and optionally the first dielectric layer into tethers associated with the interconnect (block 460). Such tethers may be formed on and around the sides of the metal interconnect by a masking and etch process.

Method 400, in one embodiment, also includes forming second perforations in the second dielectric layer and, optionally, the first dielectric layer at singulation areas associated with a device cell or an assembly of device cells (block 470). The second perforations have sharper edges than the first perforations. Representative shapes include diamond-like, rhombus, sharp elliptical, and lens shapes. The sharp edges of the second perforations facilitate singulation of a device cell or assembly of device cells from other device cells associated with the substrate. Like the first perforations, the second perforations may be formed by a masking and etch process.

After forming first perforations and second perforations, method 400 continues with partially singulating the plurality of device cells (block 480). In embodiments, the substrate is attached device-side-down to a carrier and, once attached, the substrate is etched from a backside to singulate a substrate portion of individual device cells and, in embodiments, to retain the connections of the device cells of the substrate through the dielectric layers and any metal interconnects.

Following the partial singulation, individual cells or assemblies of interconnected cells can be separated from the carrier and completely singulated from other cells at singulation areas. Alternatively, the substrate may be separated from the carrier as a whole and then individual device cells and assemblies of device cells mechanically separated from one another at singulation areas or singulated by a die or laser cutting process along the boundary defined by the second perforations) (block 490).

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
    providing a substrate comprising a device layer on which a plurality of device cells are defined;
    depositing a first dielectric layer on the device layer;
    depositing a metal interconnect on the first dielectric layer such that the deposited interconnect is electrically connected to at least two of the device cells and lies across a boundary between at least two of the electrically connected device cells;
    depositing a second dielectric layer over the first dielectric layer and over the interconnect; and
    exposing at least one contact point on the interconnect through the second dielectric layer.

2. The method of claim 1, wherein the first dielectric layer comprises a polyimide material.

3. The method of claim 1, wherein the second dielectric layer comprises one of a polyimide material and a dry film photoresist material.

4. The method of claim 1, wherein the interconnect formed on the first dielectric layer comprises a thickness of 3 microns or less.

5. The method of claim 1, wherein:
    prior to depositing the metal interconnect on the first dielectric layer, openings are formed in the first dielectric layer to at least two devices belonging to respective ones of the at least two electrically connected device cells; and
    forming the interconnect comprises depositing electrically conductive material in the formed openings.

6. The method of claim 5, wherein forming the interconnect comprises:
    depositing an electrically conductive seed layer on a surface of the first dielectric layer;
    patterning a masking material with an opening for the interconnect between the openings in the first dielectric layer;
    electrodepositing the interconnect material on the seed layer in the opening; and
    after electrodepositing the interconnect material, removing the masking material and exposed seed layer.

7. The method of 1, further comprising forming perforations in the second dielectric layer between the plurality of cells.

8. The method of claim 7, wherein the perforations comprise rounded edges.

9. The method of claim 1, wherein the plurality of circuit cells are disposed in an area of the substrate, the method further comprising:
    forming perforations in the second dielectric layer at the boundary of the area.

10. The method of claim 9, wherein the perforations comprise sharp corners.

11. The method of claim 1, further comprising patterning the second dielectric layer in an area between the at least two electrically connected device cells into a tether around the interconnect.

12. A method comprising:
    providing an interconnect to a device of a first circuit cell on a substrate and to a device of a second circuit cell on the substrate;
    forming a dielectric layer on the interconnect;
    exposing at least one contact point on the interconnect through the dielectric layer; and
    forming at least one opening in the dielectric layer between the first circuit cell and the second circuit cell,
    wherein the interconnect is electrically connected to the first circuit cell and the second circuit cell, and
    wherein the interconnect lies across a boundary between the first circuit cell and the second circuit cell.

13. The method of claim 12, wherein the opening comprises rounded edges.

14. The method of claim 12, wherein the first circuit cell and the second circuit cell are ones of a plurality of circuit cells that are disposed in an area of the substrate, the method further comprising:
   forming singulation openings in the dielectric layer at the boundary of the area.

15. The method of claim 14, wherein the singulation openings comprise sharp corners.

16. The method of claim 12, further comprising patterning the dielectric layer into a tether area around the interconnect material.

17. A method comprising:
   providing a device layer, wherein the device layer comprises a plurality of device cells;
   depositing a first dielectric layer over the device layer;
   depositing a metal interconnect over the first dielectric layer, wherein the metal interconnect is electrically connected to at least two device cells of the plurality of device cells, and wherein the metal interconnect lies across a boundary between at least two device cells of the plurality of device cells;
   depositing a second dielectric layer over the metal interconnect; and
   exposing at least one contact point on the metal interconnect through the second dielectric layer.

18. The method of claim 17, wherein the first dielectric layer comprises a polyimide material.

19. The method of claim 17, wherein the second dielectric layer comprises one of a polyimide material or a dry film photoresist material.

20. The method of claim 17, wherein the metal interconnect has a thickness of 3 microns or less.

* * * * *